Aug. 31, 1965 M. BURG 3,203,802

PHOTOPOLYMERIZABLE COMPOSITION AND ELEMENT

Filed April 9, 1962

INVENTOR
MARION BURG

BY Francis A. Painter

ATTORNEY

United States Patent Office 3,203,802

Patented Aug. 31, 1965

3,203,802
PHOTOPOLYMERIZABLE COMPOSITION AND ELEMENT

Marion Burg, Metuchen, N.J., assignor to E. I. du Pont de Nemours and Company, Wilmington, Del., a corporation of Delaware Filed Apr. 9, 1962, Ser. No. 186,222
16 Claims. (Cl. 96—87)

This invention relates to photopolymerizable compositions and to image-yielding elements and more particularly to such elements embodying photopolymerizable components. The invention also relates to processes of image reproduction using such elements.

Photosensitive layers for the formation of lithographic plates are known. Some of these layers are useful in image transfer processes wherein the transfer is accomplished in a wet system or where water-yielding materials are present in addition to light-sensitive materials. Improved processes, such as are disclosed in assignee's Burg and Cohen application Serial No. 831,700, filed August 5, 1959, now U.S. Patent 3,060,023, issued October 23, 1962, result in the formation of images without the need for water or a wet system.

In general, to obtain satisfactory reproductions by image transfer techniques, a subject having a high optical contrast is used. The original image, e.g., a sheet of paper bearing a written message, must have a high optical contrast between the writing and the background in the spectral region used to expose the photosensitive layer. While certain printing and writing inks give sufficiently high contrast to be satisfactorily reproduced, many other inks, e.g., certain duplicating inks and writing inks, including those used in ball point pens, provide low contrast images in the region of the spectrum wherein the photosensitive layer is most sensitive. Poor copies of the image are thus reproduced.

An object of this invention is to provide new photopolymerizable compositions, image-yielding elements and more particularly such elements that contain photopolymerizable materials. Another object is to provide such elements which may be used simply and dependably in simple and economic apparatus. A further object is to provide processes for forming images having good contrast at normal atmospheric conditions using relatively low intensity illumination. A particular object is to provide such processes which give a transferred image having improved contrast from a low contrast original image. Still further objects will be apparent from the following description of the invention.

The photopolymerizable compositions of this invention comprise:

(1) An addition polymerizable, non-gaseous, ethylenically unsaturated compound containing at least one terminal ethylenic group ($CH_2=C<$), having a boiling point above 100° C. at normal atmospheric pressure and being capable of forming a high polymer by free-radical initiated, chain-propagating addition polymerization, (2) At least one imine oxide sensitometric modifier containing at least one radical of the formula:

wherein the carbon atom is part of a carbocyclic ring system or is attached to hydrogen and an aromatic ring system, and the monovalent bond of the nitrogen atom is attached to a hydrocarbon or substituted hydrocarbon radical, said sensitometric modifier being present in an amount from 0.001 to 3.0 parts by weight per 100 parts by weight of constituent (1), and (3) A free-radical generating addition polymerization photoinitiator activatable by actinic radiation in an amount from 0.001 to 10 parts by weight per 100 parts by weight of the total photopolymerizable composition.

The hydrocarbon radical described in (2) above is a member selected from the group consisting of a tertiary alkyl radical of 1 to 6 carbon atoms and an aryl radical of 6 to 10 cyclic carbon atoms, e.g., alpha-cyanoisopropyl, alpha-carbethoxyisopropyl, alpha-carbamylisopropyl; phenyl, p-chlorophenyl, naphthyl, etc.

Suitable types of imine oxides wherein the carbon atom is part of a carbocyclic ring system are presented by the following formulas:

(1)

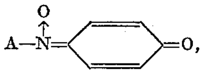

, a p-quinoneimine-N-oxide (2)

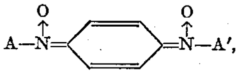

, a p-quinonediimine-N, N-dioxide (3)

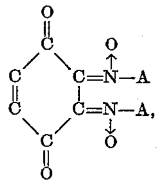

, a diimino-N,N'-dioxide (4)

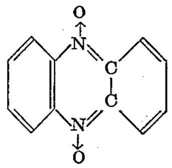

, phenazine-9,10-dioxide

A and A' in the above formulas are either an alkyl or an aryl radical as previously described. Additional compounds of this class are disclosed in assignee's U.S. Patent 2,681,918.

The imine oxides wherein the carbon atom is attached to hydrogen and an aromatic ring system are represented by the formula:

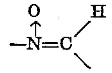

wherein said aromatic ring system is a member selected from the group consisting of phenyl and substituted phenyl, e.g., phenyl substituted with chlorine, bromine, methoxy, dimethylamino, diethylamino, etc. The monovalent bond of the nitrogen atom is attached to a phenyl or similar substituted phenyl radical as described above which may be alike or different.

The preferred compositions are solid below 18° C., have a stick temperature above 18° C. and below 220° C. and in addition contain (4) A viscosity modifying agent, preferably a thermoplastic compound which is solid at 50° C. Such agents include filler materials, both inorganic and polymeric, plasticizers and high-boiling solvents. Constituents (4) and (1) can be present in amounts from 3 to 97 and 97 to 3 parts by weight, respectively, and constituents (2) and (3) in the percentages specified above but based on the total weight of constituents (4) and (1).

In addition, particularly preferred compositions contain (5) A thermal addition polymerization inhibitor in an amount from 0.001 to 5 parts by weight per 100 parts by weight of the other components of the composition.

The image-yielding elements of the invention comprise a support bearing a photopolymerizable layer of from about 0.00005 to about 0.010 inch thickness and more preferably from 0.0001 to 0.001 inch, solid below 18° C. having a stick temperature above 18° C. and below 220° C. and comprising constitutents (1), (2) and (3) in the amounts given above. In preferred elements constituents (4) and (5) can be present in the amounts set forth above.

The photopolymerizable elements are particularly useful in image transfer processes conducted at room temperature or at elevated temperatures (thermal transfer) depending, of course, on the photopolymerizable composition utilized to form the stratum. In order to protect all embodiments of the elements from the effects of oxygen inhibition, they preferably have present on their photopolymerizable stratum at least during exposure a cover sheet such as is described in assignee's Heiart applications Serial No. 81,377, filed January 9, 1961 now U.S. Patent 3,060,026 and Serial No. 123,651, filed July 13, 1961. An element having a wax overcoating present on the photopolymerizable stratum as described in assignee's Burg application Serial No. 156,538, filed December 1, 1961, is particularly effective in the transfer processes.

The process for reproducing an image from a photopolymerizable stratum which comprises (A) Exposing with actinic radiation, imagewise, said photopolymerizable stratum comprising (1) An addition polymerizable, non-gaseous, ethylenically unsaturated compound containing at least one terminal ethylenic group ($CH_2=C<$) having a boiling point above 100° C. at normal atmospheric pressure and being capable of forming a high polymer by free-radial initiated, chain-propagating addition polymerization, (2) At least one imine oxide sensitometric modifier containing at least one radical of the formula:

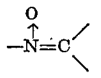

wherein the carbon atom is part of a carbocyclic ring system or is attached to hydrogen and a cyclic carbon atom, and the monovalent bond of the nitrogen atom is attached to a hydrocarbon radical, said sensitometric modifier being present in an amount from 0.001 to 3.0 parts by weight per 100 parts by weight of constituent (1), and (3) A free-radical generating addition polymerization photoinitiator activatable by actinic radiation in an amount from 0.001 to 10 parts by weight per 100 parts by weight of the total photopolymerizable composition, the photopolymerizable stratum bearing at least during said exposure a cover stratum having low permeability to oxygen and being capable of transmitting said actinic radiation, until polymerization, with an accompanying increase in stick temperature, of the photopolymerizable stratum takes place in the exposed image areas with substantially less polymeriaztion and less increase in stick temperature in the underexposed, complementary, adjoining, coplanar image areas to provide a difference of at least 10° C. in the stick temperature of said exposed and underexposed areas, and, subsequently, (B) Transferring said image corresponding to the underexposed image areas by bringing the surface of the exposed stratum into operative contact with the surface of an image-receptive support at an operating temperature intermediate between the stick temperature of said exposed and underexposed image areas and separating the two surfaces at a temperature intermediate between the stick temperature of the exposed and underexposed image areas. Preferably, the exposure is by reflex exposure technique. By using this type exposure, right-reading copies can be made from materials having messages on both sides of a page or from opaque supports, e.g., paper, cardboard, metal, etc., as well as from poor light-transmitting surfaces. It is understood that the photopolymerizable stratum or element used can contain constituents (4) and (5) in the amounts specified above.

By such an exposure and transfer operation, at least one copy of an original image can be obtained. Multiple copies can be obtained by repeating the transfer process with a new image-receptive support for each transfer. The appropriate coating thicknesses of the stratum, pressures and temperatures must be controlled to give the desired number of copies.

The term "underexposed" as used herein is intended to cover the image areas which are completely underexposed or those exposed only to the extent that there is polymerizable compound still present in sufficient quantity that the softening temperature in the underexposed image areas remains substantially lower than that of the complementary, adjoining, coplanar exposed image areas. The term "stick temperature," as applied to either an underexposed or exposed area of a photopolymerizable stratum, means the minimum temperature at which the image area in question sticks or adheres after contact for 5 seconds under slight pressure, e.g., thumb pressure, to analytical filter paper (Schleicher & Schull analytical filter paper No. 595) and remains adhered in a layer of at least detectable thickness after separation of the analyticl paper from the stratum. The term "operating temperature" means the temperature at which the operation of transferring the image from the photopolymerizable stratum to the image-receptive surface is actually carried out. The operating temperature is intermediate between the stick temperatures (as just defined) of the underexposed and the exposed areas of a photopolymerizable stratum and may be as low as room temperature or below.

In the accompanying drawing which constitutes a part of this specification,

Figure 1:
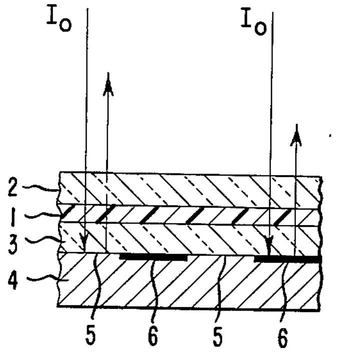
FIG. 1 is a schematic sectional view of an element being exposed reflectographically.
Figure 2:
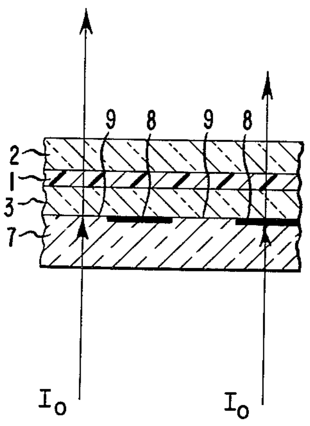
FIG. 2 is a schematic sectional view of an element beig exposed by transmitted radiation.

In FIGS. 1 and 2, a stratum of a photopolymerizable composition 1 is coated on a transparent support 2, e.g., polyethylene terephthalate, etc. The support of FIG. 2 can also be opaque or translucent if desired. A thin, transparent protective layer 3 protects the surface of the photopolymerizable stratum at least during the exposure. The element of FIG. 1 has in contact with the protective layer a generally opaque original 4, e.g., a sheet of white paper containing light areas 5 and dark areas 6 corresponding to ink-free surface areas and inked surface areas, respectively. The element of FIG. 2 has a process transparency 7, e.g., a process negative or positive (an image-bearing transparency consisting solely of substantially opaque areas 8 and substantially transparent areas 9 where the opaque areas are substantially of the same optical density, the so-called line or halftone negative or positive) in contact with its protective layer.

In FIG. 1, radiant energy coming from a source (not shown) is partially absorbed by the photopolymerizable layer as it passes through the layer. The non-absorbed radiation impinges on the surfaces of the original 4 where radiation reaching the dark areas 6 (inked areas) is reflected to a lesser degree than radiation reaching the light areas 5 (ink-free areas). The reflected radiation passes through the photopolymerizable layer wherein a further portion is absorbed. The total amount of radiation absorbed by the layer is thus sufficient to polymerize the areas of the stratum opposite the light areas but not in the areas opposite the dark areas of the original. In general, for proper reflux exposure the ratio of total exposure opposite the light areas ($E_{light}$) to total exposure opposite the dark areas ($E_{dark}$) is between about 1 and 2, depending on the subject contrast, i.e., the reflectivity of the light areas and dark areas, respectively. Typical values are about 1.5 for a high contrast subject and 1.1 or less for a low contrast subject.

In FIG. 2 the element is exposed by transmitted radiation, the degree of radiation modulation being usually greater than in reflex exposure. The ratio of $E_{light}/E_{dark}$ can vary between 1 and infinity, being generally about 10 for high contrast subjects and about 1.2 for low contrast subjects.

Figure 3:
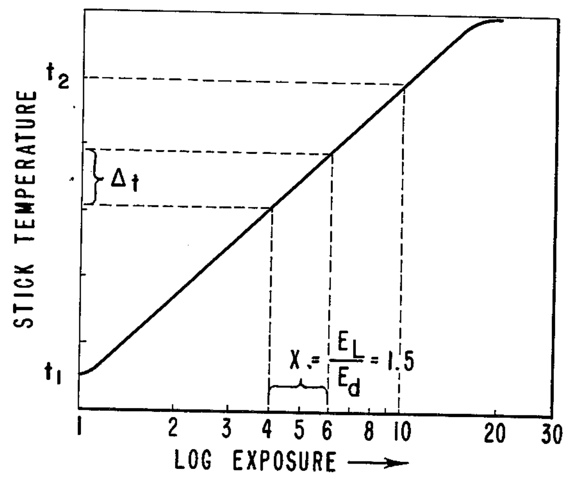
FIG. 3 is a graph containing an effective contrast curve of a photopolymerizable stratum not containing a sensitometric modifier.
Figure 4:
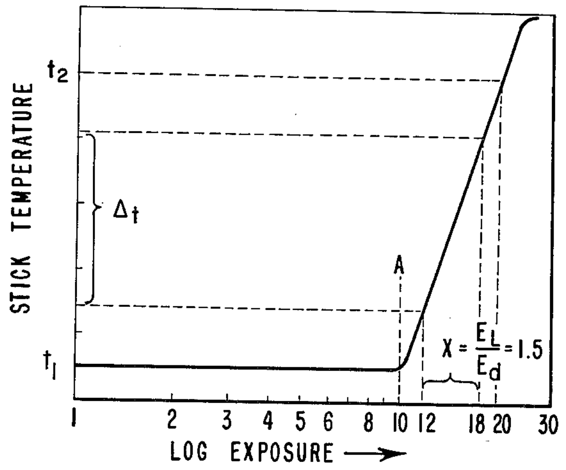
FIG. 4 is a graph containing an effective contrast curve of a photopolymerizable stratum containing a sensitometric modifier.

In FIGS. 3 and 4 the stick temperature of a photopolymerizable stratum is plotted against the log of the time of exposure to actinic radiation. FIG. 3 represents a photopolymerizable system, e.g., such as is described in Example I, but not containing a sensitometric modifier. The unexposed stratum has a stick temperature $t_1$ whereas after irradiation with, e.g., 10 exposure units, a stick temperature $t_2$ is obtained. The slope of the curve indicates the effective contrast of the material or the degree of differentiation between the underexposed and exposed areas. As indicated above, the exposure ratio for light areas ($E_{light}$) to dark areas ($E_{dark}$) is between 1 and 2 depending on the contrast of the subject and the transmittance of the sensitive layer. A preferred exposure ratio is 1.5, represented by X on the abscissa. The difference in stick temperature corresponding to such an exposure is indicated by $\Delta t$ on the ordinate.

FIG. 4 represents a similar photopolymerizable system but a sensitometric modifier of the type defined in this invention is present. While the effect of the sensitometric modifier is not definitely understood, it is believed that it prolongs the induction period until the modifier is consumed by the free radicals produced by the absorbed radiant energy (point A). Subsequently, polymerization progresses at the rate shown in FIG. 3, i.e., 10 additional exposure units raise the stick temperature from $t_1$ to $t_2$. The resultant curve, however, has a steeper slope, indicating a higher effective contrast. The exposure ratio 1.5 is represented by the portion "$x$" on the abscissa and the difference of stick temperature corresponding to this exposure is represented by $\Delta t$. It can be readily seen that $\Delta t$ has a larger value than in FIG. 3, i.e., the difference between the stick temperatures in the exposed and the under-exposed areas is greater. This permits a more complete transfer of the underexposed areas to the image-receptive support, resulting in an improved copy having higher contrast. Alternatively, a system containing a sensitometric modifier furnishes usable copies from originals having such a low subject contrast that they cannot be reproduced satifactorily with unmodified photopolymerizable systems.

Suitable free-radial initiated chain-propagating addition polymerizable ethylenically unsaturated compounds for use in this invention include preferably an alkylene or a polyalkylene glycol diacrylate prepared from an alkylene glycol of 2 to 15 carbons or a polyalkylene ether glycol of 1 to 10 ether linkages, and those disclosed in Martin & Barney U.S. Patent 2,927,022, issued March 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri- and tetramethacrylate, pentaerythritol di-, tri- and tetraacrylate, dipentaerythritol hexacrylate, tripentaerythritol octaacrylate, manitol hexacrylate, sorbitol hexacrylate, inositol hexacrylate and the corresponding methacrylates, 1,3-propanediol diacrylate, 1,5-pentanediol dimethacrylate, the bis-acrylates and methacrylates of polyethylene glycols of molecular weight 200–1500, and the like; unsaturated amides, particularly those of the alpha-methylene carboxylic acids, and especially those of alpha - omega - diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis (gamma-methacrylamidopropoxy)-ethane, beta-methacrylamidoethyl methacrylate, N-(beta-hydroxyethyl)-beta-(methacrylamido)ethyl acrylate and N,N-bis(beta-methacrylyloxyethyl) acrylamide; vinyl esters, such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadinenal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are polyfunctional, but mono-functional monomers can also be used. The amount of monomer added varies with the particular polymers used.

Some of the polymerizable monomers listed in the above paragraph are normally solid and non-tacky at room temperature. However, these monomers can be used according to this invention when they are present in combination with plasticizers or high boiling solvents so that they become pressure-transferable. Suitable materials include low molecular weight polyethylene oxides, glycerol, the phthalate esters such as dibutyl phthalate and the like.

The ethylenic unsaturation can be present as an extralinear substituent attached to a linear polymer, such as polyvinyl acetate/acrylate, cellulose acetate/acrylate, cellulose acetate/methacrylate, N-acrylyloxymethylpolyamide, N - methacrylyloxymethylpolyamide, allyloxymethylpolyamide, etc., in which case the monomer and polymer functions are combined in a single material.

In addition to the sensitometric modifiers disclosed in the examples the following imine oxide compounds are illustrative of the sensitometric modifiers of this invention, e.g., N,N'-dianisyl-p-quinonediimine-N,N'-dioxide; N,N'-di-p-dodecylphenyl-p-quinonediimine-N,N' - dioxide; N-phenyl-N'-β-naphthyl-p-quinonediimine-N,N' - dioxide; N,N'-di-β-naphthtyl - p - quinonediimine - N,N' - dioxide; N,N' - bis - (1 - cyanocyclohexyl) - p - quinonediimine-N,N'dioxide; N - cyclohexyl-N'-phenyl-p-quinonediimine-N,N' - dioxide; N,N' - diphenyl-di-phenoquinonediimine-N,N'-dioxide.

The p - quinonediimine - N,N' - dioxides and the p-quinoneimine-N-oxides are prepared according to the procedure of C. J. Pedersen: J. Am. Chem. Soc. 79 (1957) at pages 2295 and 5014, respectively. A diimine-N,N'-dioxide of the structure shown as formula (3) in the third paragraph of this specification is prepared by the method of W. Gündel and R. Pummerer, Ann. 529, 11–32 (1937). Phenazine-9,10-dioxide may be prepared by the method of H. McIlwain, J. Chem. Soc. 322 (1943). The preparation of imine oxides having the carbon (in the formula) attached to hydrogen and aromatic rings is disclosed by E. Bamberger, Ber. 27, 1556 (1894) and J. C. Splitter and M. Calvin in J. Org. Chem. 20, 1114 (1955).

Free-radical generating addition polymerization photoinitiators activatable by actinic radiation useful in this invention include preferably the substituted or unsubstituted polynuclear quinones which are compounds having two intracyclic carbonyl groups attached to intracyclic carbon atoms in a conjugated carbocyclic ring system and are thermally inactive at and below 185° C., e.g., 9,10 - anthraquinone, 1 - chloroanthraquinone, 2-chloroanthraquinone, 2 - methylanthraquinone, 2 - ethylanthraquinone, 2 - tert - butyl-anthraquinone, octamethylanthraquinone, 1,4-naphthoquinone, 1,2-phenanthrenequinone, 9,10-phenanthrenequinone, 1,2-benzanthraquinone, 2,3-benzanthraquinone, 2 - methyl-1,4-naphthoquinone, 2,3-dichloronaphthoquinone, 1,4-dimethylanthraquinone, 2,3-dimethylanthraquinone, 2 - phenylanthraquinone, 2,3 - diphenylanthraquinone, sodium salt of anthraquinone alphasulfonic acid, 3,chloro-2-methylanthraquinone, retenequinone, 7,8,9,10 - tetrahydronaphthacenequinone, and 1,2,3,4-tetrahydrobenz-(a)anthracene-7,12-dione. Other photoinitiators which are also useful, even though some may be thermally active at temperatures as low as 85° C., include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin. Light sensitive silver compounds, preferably in conjunction with peroxygen compounds such as peroxides or persulfates are also useful as free-radical generating initiators activatable by actinic radiation as are the azo initiators disclosed in assignee's Burg applications Serial No. 156,529 and Serial No. 156,530, filed December 1, 1961.

Preferably the photopolymerizable composition contains a viscosity modifying agent in the amounts specified above. Suitable such agents include thermoplastic compounds, e.g., (A) Copolyesters, e.g., those prepared from the reaction product of a polymethylene glycol of the formula $HO(CH_2)_nOH$, wherein n is a whole number 2 to 10, inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g., N-methoxymethyl polyhexamethylene adipamide;

(C) Extralinear unsaturated polyamides of assignee's Burg application Serial No. 753,196, filed August 5, 1958 now U.S. Patent 3,043,805, e.g., N-methacrylyloxymethyl and N-acrylyloxymethyl polyamides.

(D) Vinylidene chloride copolymers, e.g., vinylidene chloride/acrylonitrile; vinylidene chloride/methylacrylate and vinylidene chloride/vinylacetate copolymers;

(E) Ethylene/vinyl acetate copolymers;

(F) Cellulosic ethers, e.g., methyl cellulose, ethyl cellulose and benzyl cellulose;

(G) Polyethylene;

(H) Synthetic rubbers, e.g., butadiene/acrylonitrile copolymers, and 2-chlorobutadiene-1,3 polymers;

(I) Cellulose esters, e.g., cellulose acetate, cellulose acetate succinate and cellulose acetate butyrate;

(J) Polyvinyl esters, e.g., polyvinyl acetate/acrylate, polyvinyl acetate/methacrylate and polyvinyl acetate;

(K) Polyacrylate and alpha-alkyl polyacrylate esters, e.g., polymethyl methacrylate and polyethyl methacrylate;

(L) High molecular weight polyethylene oxides of polyglycols having average molecular weights from about 4,000 to 1,000,000;

(M) Polyvinyl chloride and copolymers, e.g., polyvinyl chloride/acetate;

(N) Polyvinyl acetal, e.g., polyvinyl butyral, polyvinyl formal;

(O) Polyformaldehydes;

(P) Polyurethanes;

(Q) Polycarbonates;

(R) Polystyrenes.

To the photopolymerizable composition there can also be added non-thermoplastic polymeric compounds to improve certain desirable characteristics, e.g., adhesion to the base support, adhesion to the image receptive support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photo polymerizable layers can also contain immiscible polymeric or non-polymeric organic or inorganic fillers or reinforcing agents which are essentially transparent at the wavelengths used for the exposure of the photopolymeric material, e.g., the organophilic silicas, bentonites, silica, powdered glass, colloidal silver, as well as various types of dyes and pigments. Such materials are used in amounts varying with the desired properties of the photopolymerizable layer. The fillers are useful in improving the strength of the composition, reducing tack and, in addition, as coloring agents.

Suitable polymerization inhibitors that can be used in photopolymerizable compositions include p-methoxyphenol, hydroquinone, alkyl and aryl-substituted hydroquinones and quinones, tert-butylcatechol, pyrogallol, copper resinate, naphthylamines, beta-naphthol, cuprous chloride, 2,6-ditert-butyl-p-cresol, phenothiazine, pyridine, nitrobenzene, dinitrobenzene, iodine and sulfur. Other useful inhibitors include p-toluquinone and chloranil.

Various dyes, pigments, thermographic compounds and color-forming components can be added to the photopolymerizable compositions to give varied results after the transfer. These additive materials, however, preferably should not absorb excessive amounts of radiation at the exposure wavelength or inhibit the polymerization reaction.

Among the dyes useful in the invention are Fuchsin (CI 42510), Auramine Base (CI 41000B), Calcocid Green S (CI 44090), Para Magenta (CI 42500), Tryparosan (CI 42505), New Magenta (CI 42520), Acid Violet RRL (CI 42425), Red Violet 5RS (CI 42690), Nile Blue 2B (CI 51185), New Methylene Blue GG (CI 51195), CI Basic Blue 20 (CI 42585), Iodine Green (CI 42556), Night Green B (CI 42115), CI Direct Yellow 9 (CI 19540), CI Acid Yellow 17 (CI 18965), CI Acid Yellow 29 (CI 18900), Tartrazine (CI 19140), Supramine Yellow G (CI 19300), Buffalo Black 10B (CI 27790), Naphthalene Black 12R (CI 20350), Fast Black L (CI 51215), and Ethyl Violet (CI 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent nonphotosensitive layer.

Useful thermographic additives, e.g., 3-cyano-4,5-dimethyl-5-hydroxy-3-pyrrolin-2-one are disclosed in Howard, U.S. Patent 2,950,987. Such compounds, in the presence of activators, e.g., copper acetate, are disclosed in assignee's Belgian Patent 588,328. Other useful thermographic additives are disclosed in the following U.S. Patents: 2,625,494; 2,637,657; 2,663,654; 2,663,655; 2,663,656; and 2,663,657.

Suitable color-forming components which form colored compounds on the application of heat or when brought in contact with other color-forming components on a separate support include, (1) *Organic and inorganic components.*—Dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) *Inorganic components.*—Ferric salts and potassium thiocyanate; ferrous salts and potassium ferricyanide; copper, mercury or silver salts and sulfide ions; lead acetate and sodium sulfide.

(3) *Organic components.*—2,4-dinitrophenylhydrazine and aldehydes or ketones; diazonium salt and phenol or naphthol, e.g., benzenediazonium chloride and beta-naphthol; substituted aromatic aldehydes or amines and a color photographic developer compound, e.g., p-dimethylaminobenzaldehyde and p-diethylaminoaniline; color photographic developer compound/active methylene compound and an oxidizing agent, e.g., p-diethylaminotoluidine/α-cyanoacetophenone and potassium persulfate.

The photopolymerizable composition is preferably coated on a base support. Suitable support materials are stable at the operating temperatures used in the instant invention. Suitable bases or supports include those disclosed in U.S. Patent 2,760,863, glass, wood, paper (including waxed or transparentized paper), cloth, cellulose esters, e.g., cellulose acetate, cellulose propionate, cellulose butyrate, etc., and other plastic compositions such as polyamides, polyesters, e.g., polyethylene terephthalate, etc. The support may have in or on its surface and beneath the photopolymerizable stratum an antihalation layer as disclosed in said patent or other substrata needed to facilitate anchorage to the base.

Prior to image transfer of a portion of the photopolymerizable layer in the underexposed areas, the layer is exposed to actinic radiation. This may be done as explained above reflectographically or by transmitted light through a two-tone, halftone, or continuous tone image or transparency. The image or transparency may or may not be in operative contact with the transferable layer, e.g., contact exposure or projection exposure can be made. It is possible to expose through paper or other light-transmitting materials. A stronger radiation source or longer exposure times must be used, however.

Since the preferred free-radical generating addition-polymerization initiators activatable by actinic radiation, e.g., 9,10-phenanthrenequinone, exhibit at least part of their sensitivity in the visible range, the radiation source should furnish an effective amount of this radiation. Such sources include carbon arcs, mercury-vapor arcs, fluorescent lamps, argon glow lamps, electronic flash units and photographic flood lamps. Of these, the mercury-vapor arcs, particularly the sunlamp type, and the fluorescent lamps, are most suitable. The sunlamp mercury-vapor arcs are customarily used at a distance of one and one-half to 20 inches from the photopolymerizable layer. Other initiators may require higher amounts of ultraviolet radiation to be effective. In such cases, the radiation source should furnish an effective amount of ultraviolet radiation. Many of the radiation sources listed above furnish the required amount of this radiation.

After the exposure of the photopolymerizable layer and removal of the cover sheet, where present, the exposed composition is brought into intimate contact with the support at room temperature, while pressure and, if necessary, heat is applied to effect the transfer of the underexposed areas of the photopolymerizable composition. Pressure can be applied by means well known to the art, e.g., rollers, flat or curved surfaces or platens, etc. The duration of contact of the photopolymerizable stratum and the image-receptive surface can range from 0.01 to 10 seconds, about 0.1 second in general being adequate. The shorter periods of contact are possible by using an intense radiant source of heat, e.g., infrared lamps or heat sources. Alternatively, images can be obtained by stripping and dusting processes according to Burg and Cohen, U.S. application Serial No. 850,522, filed November 3, 1959, now U.S. Patent 3,060,025 and Serial No. 839,304, filed September 11, 1959, now U.S. Patent 3,060,024.

The image-receptive support to which the image is transferred must be stable at the operating temperatures. The particular support used is dependent on the desired use for the transferred image and on the adhesion of the image to the base. Suitable supports include paper including bond paper, resin and clay sized paper, resin coated or impregnated paper, cardboard, aluminum, copper, steel, bronze, etc.; wood, glass, nylon, rubber, polyethylene, linear condensation polymers such as the polyesters, e.g., polyethylene terephthalate, regenerated cellulose, cellulose esters, e.g., cellulose acetate, silk, cotton, viscose rayon and metal fabrics or screens. The image-receptive support may have a hydrophilic surface or may contain on its surface chemical compounds which react with compounds being transferred so as to produce differences in color, hydrophilicity or conductivity between the exposed and underexposed areas or for improved adhesion to or brightening of the receptive support. The image-receptive surface may be smooth, contain roughening agents such as silica, be perforated or be in the form of a mesh or screen.

The invention will be further illustrated by, but is not intended to be limited to, the following detailed examples.

*Example I*

The following solution was prepared:

| | | |
|---|---|---|
| Cellulose acetate butyrate | g | 2.0 |
| Polyethylene glycol diacrylate | g | 2.0 |
| Phenanthrenequinone | mg | 40.0 |
| p-Methoxyphenol | mg | 2.0 |
| N,N'-diphenyl-p-quinonediimine-N,N'-dioxide | mg | 4.0 |
| Crystal Violet (C.I. Basic Violet 3) | mg | 5.0 |
| Acetone | g | 16.0 |

The cellulose acetate butyrate contained 20.5% acetyl groups and 26% butyryl groups and had a viscosity of 9.0–13.5 poises as determined by A.S.T.M. method D–871–54T. The polyethylene glycol diacrylate was prepared from a diol precursor of average molecular weight of 300.

This solution was coated in subdued light on a 1-mil thick sheet of polyethylene terephthalate and was dried. The dry coating had a thickness of 0.35 mil. A second sheet of 1-mil thick polyethylene terephthalate was laminated to the coating to form a cover sheet.

The cover sheet of this assembly was placed in contact with a white, opaque paper bearing a message in black ink and placed in a printing frame to insure good contact. A reflectographic exposure of 5.5 seconls was made through the support of the light-sensitive element, using a 400-watt high pressure mercury arc lamp at a distance of 10.5 inches. The exposed element was removed from the printing frame, the cover sheet was stripped off and the photopolymer layer was brought into contact with a sheet of plain white paper. The sandwich was then passed between two rollers, one of which was heated to 128° C. The two sheets were immediately separated as they emerged from the rollers. The underexposed areas of the thermoplastic coating, corresponding to the printed areas of the original, transferred to the paper support forming a right reading, well-defined, high contrast, violet-colored copy of the original message. Multiple copies were obtained by repeating the thermal transfer step using a new image-receptive support for each copy.

In like manner, high contrast copies were obtained from originals made by the "Ditto" and "Azo" duplicating process of the A. B. Dick Company, Chicago, Illinois having an optical density for the actinic radiation of 0.08.

A laminated control coating similar to the one described above but containing no sensitometric modifier on transfer gave poor copies having low contrast and definition from low contrast "Ditto" or "Azo" originals.

*Example II*

A coating composition was prepared from:

| | | |
|---|---|---|
| Cellulose acetate butyrate | g | 1.0 |
| Cellulose acetate | g | 0.6 |
| Polyethylene glycol diacrylate | g | 2.4 |
| Phenanthrenequinone | mg | 40.0 |

| | | |
|---|---|---|
| N,N'-Diphenyl-p-quinonediimine-N,N'-dioxide dissolved in 1.5 ml. of chloroform | mg | 2.54 |
| p-Methoxyphenol | mg | 1.0 |
| Dye solution | g | 5.0 |
| Acetone to make 20.0 g. | | |

The cellulose acetate had 39% acetyl groups and an ASTM viscosity of 45 poises. The dye solution was obtained by dissolving in a mixture of 80 ml. of ethanol and 40 ml. of acetone, 0.6 g. of a blue-black dye prepared by condensing 1 mole of Rhodamine 5G (C.I. Basic Dye No. 45105) 0.7 mole of Crystal Violet (C.I. Basic Violet 3) and 1 mole of Victoria Pure Blue BO (C.I. Basic Blue 7) with 1 mole of Luxol Fast Blue MBSN Base (C.I. Solvent Blue 38).

This solution was coated, dried and laminated to a cover sheet as described in Example I. A three-second reflectographic exposure to a black/white original, using a 20-watt blue fluorescent light, followed by a thermal transfer at 120° C. to a white paper image-receptive support furnished a good quality, high contrast, blue colored copy of the original.

In a similar manner a high contrast copy of a "Ditto" original as described in Example I was obtained, using a five-second exposure. A control coating without the quinonediimine compound gave only a very poor copy of the low contrast original.

*Example III*

Examples I and II were repeated except that the imine oxide compound was replaced by 3.4 mg. of N,N'-di-(alpha-cyanoisopropyl)-p-quinonediimine-N,N' - dioxide. Reflectographic exposures to photoflood and fluorescent light gave high contrast copies of low contrast "Azo" and "Ditto" originals as described in Example I.

*Example IV*

A light-sensitive coating similar to that of Example I was prepared, except that the imine oxide compound was replaced by 3.4 mg. of 5,6-bis(4-dimethylaminophenyl-imine)-2-cyclohexene - 1,4 - dione - N,N'-dioxide, dissolved in 1.5 ml. of chloroform. The coating was exposed by reflex to a high contrast original, using a Macbeth 140-ampere high intensity carbon arc light source at a distance of about 16 inches from the coating. The exposure was made through a neutral density filter ($D=1.40$) for two seconds, and the thermal transfer to an image-receptive layer was made at at roller temperature of 125° C. A good copy of the original was obtained.

A similar coating, but containing 6.8 mg. of the sensitometric modifier, was exposed by reflex to a low contrast "Azo" original as described in Example I for seven seconds with a 20-watt blue fluorescent light source. Upon thermal transfer at 125° C., a good copy of the original was obtained.

*Example V*

Example II was repeated, except that the imine oxide compound was replaced by 3.6 mg. of phenazine-9,10-dioxide. High contrast copies of low contrast originals were obtained after reflex exposure for 3 seconds with a 20-watt blue fluorescent light followed by thermal transfer to a white paper support at 110° C.

*Example VI*

Example I was repeated, except that the imine oxide compound was replaced by 3.6 mg. of N-(p-hydroxyphenyl)-p-quinoneimine - N - oxide. Reflectographic exposure through a neutral density filter ($D=1.1$) for two seconds to a 140-ampere carbon arc placed at 16 inches from the coating surface followed by thermal transfer at 115° C. to a paper image-receptive support gave a good copy of a high contrast original.

A copy of a low contrast "Ditto" original as described in Example I was made by exposing the element surface reflectographically with a 20-watt blue fluorescent light for 5 seconds and using the same transfer conditions, good results being obtained.

*Example VII*

A light-sensitive layer similar to that of Example I was prepared, except that the imine oxide compound was replaced by 3.2 mg. of N,N'-diphenyldiphenoquinone-diimine-N,N'-dioxide dissolved in 3.2 ml. of chloroform. A three-second reflectographic exposure with a 20-watt blue fluorescent light followed by a thermal transfer at 120° C. to a paper image-receptive layer gave a high contrast reproduction of a low contrast "Ditto" original as described in Example I.

*Example VIII*

The following solution was prepared in subdued light:

| | | |
|---|---|---|
| Cellulose acetate butyrate | g | 1.1 |
| Cellulose acetate | g | 0.6 |
| Polyethylene glycol diacrylate | g | 2.3 |
| p-Methoxyphenol | mg | 1.0 |
| Phenanthrenequinone | mg | 40.0 |
| N-Benzylideneaniline-N-oxide | mg | 3.3 |
| Dye solution of Example II | g | 5.0 |
| Methanol | g | 1.0 |
| Acetone | g | 10.0 |

The cellulose acetate butyrate and polyethylene glycol diacrylate are described in Example I; the cellulose acetate is described in Example II. This solution was coated on polyethylene terephthalate film and laminated to a cover sheet as described in Example I. A high contrast copy of a "Ditto" original as described in Example I was obtained by exposing the element surface reflectographically for 5 seconds with a 20-watt blue fluorescent light and thermally transferring the underexposed image areas at 115° C. to a paper image-receptive support.

*Example IX*

Example VIII was repeated, except that the N-benzylideneaniline-N-oxide was replaced by 3.8 mg. of N-(p-chlorobenzylidene)aniline - N - oxide. Utilizing the exposure and transfer conditions of Example VIII, a high contrast copy of a low contrast original was obtained as described in that example.

*Example X*

Example VIII was repeated, using 4.1 mg. of N-(p-dimethylaminobenzylidene)aniline-N-oxide in place of the imine oxide compound of that example. Utilizing the exposure and transfer conditions as set forth therein, a high contrast reproduction of a low contrast original was obtained as described in that example.

*Example XI*

A thermoplastic, photopolymerizable composition was prepared from the following solution:

| | | |
|---|---|---|
| Cellulose acetate butyrate | g | 2.0 |
| Cellulose acetate | g | 1.2 |
| Triethylene glycol diacrylate | g | 1.2 |
| Pentaerythritol tetraacrylate | g | 3.6 |
| Phenanthrenequinone | mg | 80.0 |
| p-Methoxyphenol | mg | 2.0 |
| N,N' - Bis(α - carbethoxyisopropyl)-p - quinonediimine-N,N'-dioxide | mg | 6.1 |
| Dye solution of Example II | g | 10.0 |
| Acetone to make 40.0 g. | | |

The cellulose acetate butyrate utilized is described in Example I and the cellulose acetate is described in Example II. This solution was coated on a polyethylene terephthalate film and was laminated to a cover sheet as described in Example I. Reflectographic exposure to low contrast "Ditto" and "Azo" originals as described in Example I, using a three-second exposure with a 20-watt blue fluorescent light, followed by a thermal transfer at 110° C. yielded good quality copies of the image on the paper image-receptive support.

In the above examples, the abbreviation CI refers to the Colour Index, 2nd Edition 1956, The Society of Dyers and Colourists, Dean House, Piccadilly, Bradford, Yorkshire, England and The American Association of Textile Chemists and Colorists, Lowell Technological Institute, Lowell, Massachusetts, U. S. A.

The above-described photopolymerizable compositions are utilized in the preparation of photopolymerizable elements useful in image transfer processes conducted at room temperature or at elevated temperatures. Such processes are useful for a variety of copying, printing, decorative and manufacturing applications. Multicopies of the process images can be obtained from the transferred image. The number of copies prepared is dependent on the photopolymerizable composition thickness as well as the process conditions. The process is also useful for preparing multicolor reproductions.

Lithographic surfaces can be produced by transferring a hydrophobic layer to a hydrophilic receptor surface or a hydrophilic layer to a hydrophobic receptor surface. The images on the lithographic surface can be made impervious to chemical or solvent attack by post-exposing the lithographic surface. Alternatively, the exposed areas of the photopolymerizable composition, after the underexposed areas are transferred, can be used as a lithographic-offset printing plate if they are hydrophobic and the original sheet support is hydrophilic or vice versa. Silk screens can also be made by this process.

The transferred images are not only useful for making copies of the original image by dry methods as indicated above but after transfer of the underexposed areas to a receptor support, the exposed surface can be treated with, e.g., aqueous solutions, dyes, inks, etc., to form colored images. Colored copies of the original image can be obtained when the wet surface is brought into intimate contact with a receptor support and the surfaces separated. Solvents which are used for the spirit copying, e.g., ethanol, water, should meter out the dye used and be a nonsolvent for the polymer, i.e., the solubility of the dye and binder are important factors in selecting the solvent.

The exposed photopolymerized stratum can be brought into intimate contact at room temperature with a separate support, e.g., a roll of carbon or graphite; a roll coated with pigment dispersions; a roll which has a continuously replenished pigment or inked surface; a separate support coated with pigments with or without dyes, color-forming compounds, hydrophilic and hydrophobic surfaces or a metallized film. Upon removing the surfaces, the areas corresponding to the underexposed areas of the photopolymerized composition are transferred. A duplicate copy and a reverse copy are formed simultaneously.

The exposed photopolymerized surfaces are also useful with various dusting techniques, e.g., with finely divided dyes and pigments, the materials adhering in the underexposed areas. Multiple copies can be prepared. The dusted films are useful as filters, in the preparation of lithographic printing plates by using hydrophilic or hydrophobic materials, in the manufacture of printed circuits and electrically conducting or photoconductive matrices, in the preparation of two and multicolor reproductions and phosphor and ceramic patters.

In addition to the above uses, the photopolymerizable compounds are useful in other processes involving development of an image, e.g., in preparing relief printing plates or offset plates wherein solvent removal of unpolymerized material might be used. Thus, these elements would be useful in processes such as described in Plambeck U.S. Patent 2,760,863 and in Martin et al., U.S. Patent 2,927,022.

An advantage of this invention is that a photopolymerizable stratum containing the above-described sensitometric modifiers even when given a conventional exposure at normal atmospheric conditions with relatively low intensity illumination provides excellent reproductions of the original image upon transfer. Another advantage is that a transferred image of improved contrast can be obtained from an original low contrast image. A further advantage is that elements prepared from the photopolymerizable compositions of this invention may be used simply and effectively in simple and economic apparatus.

Many other uses and advantages can be envisioned for the compositions and elements within the scope of this invention.

What is claimed is:

1. A photopolymerizable composition capable of forming relatively high-contrast images when subjected to relatively low-contrast imagewise irradiation, which composition comprises:

(1) an addition polymerizable, non-gaseous, ethylenically unsaturated compound containing at least one terminal ethylenic group, having a boiling point above 100° C. at normal atmospheric pressure and being capable of forming a high polymer by free-radical initiated, chain-propagating addition polymerization, (2) at least one imine oxide sensitometric modifier selected from the group consisting of:

(a)

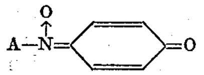

(b)

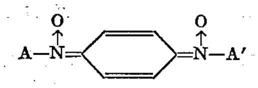

(c)

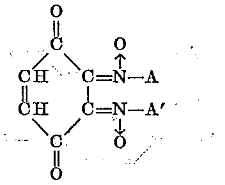

(d)

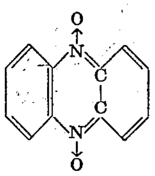

(e)

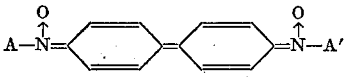

(f)

$$A-\overset{\overset{O}{\uparrow}}{N}=CH-Z$$

wherein: A and A′ are substituted and unsubstituted hydrocarbon radicals selected from the group consisting of tertiary alkyl radicals of 1 to 6 carbon atoms and aryl radicals of 6 to 10 cyclic carbon atoms; and, Z is an aromatic ring system; said sensitometric modifier being present in an amount from 0.001 to 3 parts by weight per 100 parts by weight of constituent (1), and (3) a free-radical generating addition polymerization photoinitiator activatable by actinic radiation.

2. A composition according to claim 1 which is solid below 18° C., has a stick temperature above 18° C. and below 220° C. and in addition contains:

(4) a viscosity modifying agent consisting of a thermoplastic compound solid at 50° C.

3. A composition as defined in claim 2 wherein constituents (1) and (4) are present in amounts from 97 to 3 and 3 to 97 parts by weight and constituent (3) is present in an amount from 0.001 to 10 parts by weight based on the weight of constituents (1) and (4).

4. A composition as defined in claim 2 containing an additional thermal addition polymerization inhibitor, said inhibitor being present in an amount from 0.001 to 5.0 parts by weight per 100 parts by weight of constituents (1) and (4).

5. A composition as defined in claim 1 wherein said sensitometric modifier is N,N'-diphenyl-p-quinonediimine-N,N'-dioxide.

6. A composition as defined in claim 1 wherein Z is selected from the group consisting of phenyl and substituted phenyl.

7. A composition as defined in claim 1 wherein said sensitometric modifier is N-benzylideneaniline-N-oxide.

8. A photopolymerizable composition as defined in claim 1 wherein substituent (1) is a thermoplastic polymeric compound having pendent terminally unsaturated groups and being capable of forming a polymer by free-radical initiated polymerization.

9. A photopolymerizable element capable of forming relatively high-contrast images when subjected to relatively low-contrast imagewise irradiation, which element comprises a support bearing a photopolymerizable layer of from 0.00005 to 0.010 inch thickness of a photopolymerizable composition comprising:

(1) an addition polymerizable, non-gaseous, ethylenically unsaturated compound containing at least one terminal ethylenic group, having a boiling point above 100° C. at normal atmospheric pressure and being capable of forming a high polymer by free-radical initiated, chain-propagating addition polymerization, (2) at least one imine oxide sensitometric modifier selected from the group consisting of:

(a)

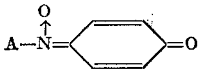

(b)

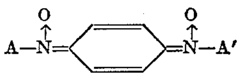

(c)

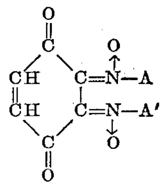

(d)

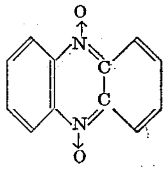

(e)

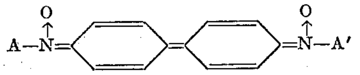

(f)

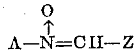

wherein: A and A' are substituted and unsubstituted hydrocarbon radicals selected from the group consisting of tertiary alkyl radicals of 1 to 6 carbon atoms and aryl radicals of 6 to 10 cyclic carbon atoms; and, Z is an aromatic ring system; said sensitometric modifier being present in an amount from 0.001 to 3 parts by weight per 100 parts by weight of constituent (1), (3) a free-radical generating addition polymerization photoinitiator activatable by actinic radiation, and (4) a viscosity modifying agent consisting of a thermoplastic compound solid at 50° C.

10. An element as defined in claim 9 wherein constituents (1) and (4) are present in amounts from 97 to 3 and 3 to 97 parts by weight and constituent (3) is present in an amount from 0.001 to 10 parts by weight based on the weight of constituents (1) and (4).

11. An element as defined in claim 9 wherein said support is a flexible, transparent support.

12. An element as defined in claim 11 wherein said support is a polyester film.

13. An element as defined in claim 9 wherein Z is selected from the group consisting of phenyl and substituted phenyl.

14. A photopolymerizable element as defined in claim 9 wherein substituent (1) is a thermoplastic, polymeric compound having pendent terminally unsaturated groups and being capable of forming a polymer by free-radical initiated chain-propagating addition polymerization, and substituent (3) is present in an amount from 0.001 to 10 parts by weight per 100 parts by weight of said thermoplastic polymeric compound.

15. A composition as defined in claim 1 wherein the ethylenically unsaturated compound (1) is a diacrylate ester of a glycol.

16. A photopolymerizable element as defined in claim 9 wherein the ethylenically unsaturated compound (1) is a diacrylate ester of a glycol.

References Cited by the Examiner

UNITED STATES PATENTS

| | | | |
|---|---|---|---|
| 2,831,805 | 4/58 | Pedersen | 204—158 |
| 3,060,023 | 10/62 | Burg et al. | 96—115 X |

NORMAN G. TORCHIN, *Primary Examiner.*